US009934844B2

(12) United States Patent
Ngo et al.

(10) Patent No.: US 9,934,844 B2
(45) Date of Patent: Apr. 3, 2018

(54) SRAM BIT-LINE AND WRITE ASSIST APPARATUS AND METHOD FOR LOWERING DYNAMIC POWER AND PEAK CURRENT, AND A DUAL INPUT LEVEL-SHIFTER

(71) Applicant: Intel Corporation, Santa Clara, CA (US)

(72) Inventors: Hieu T. Ngo, Austin, TX (US); Daniel J. Cummings, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/396,341

(22) Filed: Dec. 30, 2016

(65) Prior Publication Data

US 2017/0110184 A1    Apr. 20, 2017

Related U.S. Application Data

(63) Continuation of application No. 14/884,451, filed on Oct. 15, 2015, now Pat. No. 9,697,887, which is a
(Continued)

(51) Int. Cl.
*G11C 5/14* (2006.01)
*G11C 11/419* (2006.01)
(Continued)

(52) U.S. Cl.
CPC ........ *G11C 11/419* (2013.01); *G06F 17/5072* (2013.01); *G11C 5/066* (2013.01);
(Continued)

(58) Field of Classification Search
CPC .... G11C 7/10; G11C 7/12; G11C 7/22; G11C 11/409; G11C 5/066; G11C 5/14;
(Continued)

(56) References Cited

U.S. PATENT DOCUMENTS

| 6,006,310 A | 12/1999 | Klein |
| 6,031,781 A * | 2/2000 | Tsuji ........................ G11C 8/10 |
| | | 365/189.08 |

(Continued)

FOREIGN PATENT DOCUMENTS

| CN | 101937706 | 1/2011 |
| TW | 200613974 | 5/2006 |

(Continued)

OTHER PUBLICATIONS

First Office Action dated Jan. 10, 2017 for Chinese Patent Application No. 201280077340.3.
(Continued)

*Primary Examiner* — Tan T. Nguyen
(74) *Attorney, Agent, or Firm* — Green, Howard, & Mughal LLP

(57) ABSTRACT

Described is an apparatus comprising a plurality of memory arrays, local write assist logic units, and read/write local column multiplexers coupled together in a group such that area occupied by the local write assist logic units and the read/write local column multiplexers in the group is smaller than it would be when global write assist logic units and the read/write global column multiplexers are used. Described is a dual input level-shifter with integrated latch. Described is an apparatus which comprises: a write assist pulse generator operating on a first power supply; one or more pull-up devices coupled to the write assist pulse generator, the one or more pull-up devices operating on a second power supply different from the first power supply; and an output node to provide power supply to a memory cell.

27 Claims, 13 Drawing Sheets

Related U.S. Application Data continuation of application No. 14/606,942, filed on Jan. 27, 2015, now Pat. No. 9,208,860, which is a continuation of application No. 13/976,326, filed as application No. PCT/US2012/071714 on Dec. 27, 2012, now Pat. No. 8,971,097.

(51) Int. Cl.

| | | |
|---|---|---|
| *G11C 5/06* | (2006.01) | |
| *G11C 7/12* | (2006.01) | |
| *G06F 17/50* | (2006.01) | |
| *G11C 11/4074* | (2006.01) | |
| *G11C 11/4096* | (2006.01) | |
| *G11C 11/413* | (2006.01) | |

(52) U.S. Cl.
CPC .............. *G11C 5/14* (2013.01); *G11C 7/12* (2013.01); *G11C 11/4074* (2013.01); *G11C 11/4096* (2013.01); *G11C 11/413* (2013.01)

(58) Field of Classification Search
CPC . G11C 11/413; G11C 11/419; G11C 11/4074; G11C 11/4096; G06F 17/5072
USPC ............ 365/189.11, 185.11, 189.15, 189.16, 365/230.03, 63, 226
See application file for complete search history.

(56) References Cited

U.S. PATENT DOCUMENTS

| | | | | |
|---|---|---|---|---|
| 6,075,741 | A * | 6/2000 | Ma ............................ | G11O 5/14 365/194 |
| 6,125,078 | A | 9/2000 | Ooishi | |
| 7,158,436 | B2 * | 1/2007 | Lee ........................... | G11O 5/14 365/189.06 |
| 7,260,020 | B2 * | 8/2007 | Anvar .................. | G06F 13/4086 365/189.16 |
| 7,586,806 | B2 | 9/2009 | Wong | |
| 7,679,948 | B2 | 3/2010 | Park et al. | |
| 8,184,489 | B2 | 5/2012 | Tanzawa | |
| 8,525,546 | B1 | 9/2013 | Arsovski et al. | |
| 8,797,783 | B1 | 8/2014 | Bartling et al. | |
| 8,854,858 | B2 | 10/2014 | Bartling et al. | |
| 8,947,951 | B2 | 2/2015 | Baeck et al. | |
| 8,964,489 | B2 | 2/2015 | Salto | |
| 8,995,208 | B2 | 3/2015 | Jung et al. | |
| 2005/0232010 | A1 | 10/2005 | Cernea | |
| 2005/0259501 | A1 | 11/2005 | Anvar et al. | |
| 2008/0143417 | A1 | 6/2008 | Campbell et al. | |
| 2009/0116307 | A1 | 5/2009 | Cottier et al. | |
| 2011/0075491 | A1 | 3/2011 | Yun | |
| 2012/0014172 | A1 | 1/2012 | Jung et al. | |
| 2012/0051160 | A1 | 3/2012 | Tao et al. | |
| 2012/0213023 | A1 | 8/2012 | Dawson et al. | |
| 2012/0307550 | A1 | 12/2012 | Yu et al. | |
| 2013/0100730 | A1 | 4/2013 | Chang et al. | |
| 2013/0343135 | A1 | 12/2013 | Baeck et al. | |
| 2014/0085993 | A1 * | 3/2014 | Tao .......................... | G11C 7/08 365/194 |

FOREIGN PATENT DOCUMENTS

| | | |
|---|---|---|
| TW | 200713326 | 4/2007 |
| TW | 200830318 | 7/2008 |
| WO | 2014105013 | 7/2014 |

OTHER PUBLICATIONS

Non-Final Office Action dated Jan. 6, 2017, for Taiwan Patent Application No. 105102678.
Notice of Allowance dated Mar. 1, 2017 for U.S. Appl. No. 14/884,451.
Office Action and Search Report for counterpart Taiwan Application No. 102143015, 14 pages, dated Sep. 25, 2015, including translation.
Garcia, Jose C., et al., "High Performance Bootstrapped CMOS Low to High-Swing Level-Converter for On-Chip Interconnects," 18th European Conference on Circuit Theory and Design pp. 795-798 2007.
International Search Report and Written Opinion issued for International Patent Application No. PCT/US2012/071714, dated Sep. 12, 2013 11 pages.
Non Final Office Action for U.S. Appl. No. 14/884,451, dated Aug. 12, 2016.
Non-Final Office Action dated Apr. 28, 2017 for U.S. Appl. No. 15/396,339.
Notice of Allowance for Korea Patent Application No. 10-2015-7012437, dated Mar. 27, 2017.
Notice of Allowance for U.S. Appl. No. 13/976,326, dated Nov. 7, 2014.
Notice of Allowance for U.S. Appl. No. 14/606,942, dated Aug. 14, 2015.
Notice of Allowance for U.S. Appl. No. 14/884,451, dated Mar. 1, 2017.
Notice of Allowance dated Apr. 26, 2017 for Taiwan Patent Application No. 105102678.
Office Action for Korea Patent Application 10-2015-7012437, dated Sep. 12, 2016.
International Preliminary Report on Patentability and the Written Opinion issued for International Patent Application No. PCT/US2012/071714, dated Jun. 30, 2015, 7 pages.
Requirement for Restriction/Election for U.S. Appl. No. 14/606,942, dated Jun. 2, 2015.
Shrivastava, Aatmesh et al., "A Charge Pump Based Receiver Circuit for Voltage Scaled Interconnect," International Symposium on Low Power Electronics and Design DD. 327-332 2012.
Zhang, Hui, et al., "Low-Swing On-Chip Signaling Techniques: Effectiveness and Robustness," IEEE Transactions on Very Large Scale Integration (VLSI) Systems, vol. 8 No. 3 nn.264-272 Jun. 2000.
Non-Final Office Action dated Sep. 14, 2017 for U.S. Appl. No. 15/396,339.
Notification of Grant dated Sep. 5, 2017 for Chinese Patent Application No. 201280077340.3.
Office Action & Search Report dated Sep. 25, 2017 for Taiwan Patent Application No. 106106667.
Office Action and Search Report dated Aug. 21, 2017 for Taiwan Patent Application No. 106101232.

* cited by examiner

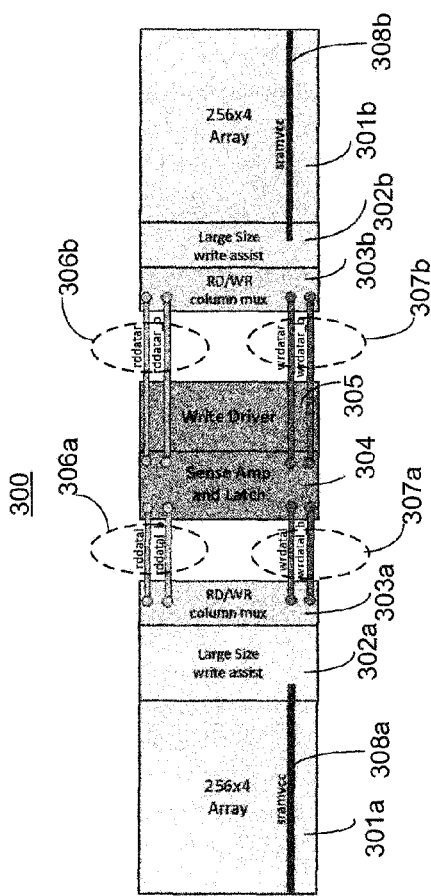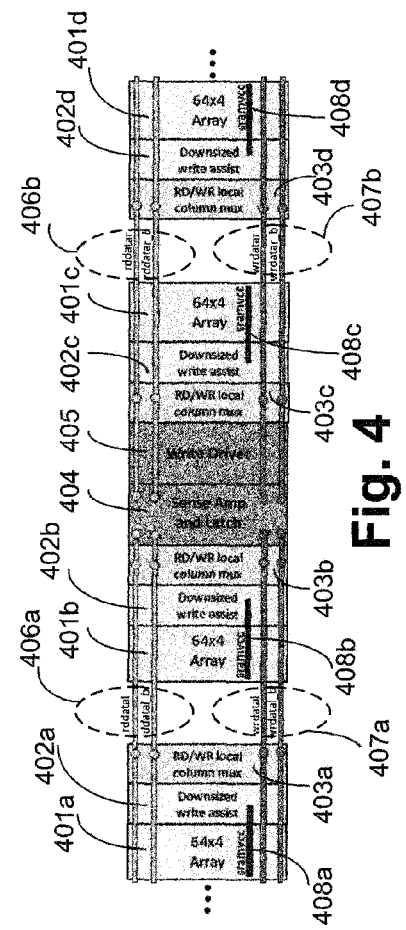

US 9,934,844 B2

SRAM BIT-LINE AND WRITE ASSIST APPARATUS AND METHOD FOR LOWERING DYNAMIC POWER AND PEAK CURRENT, AND A DUAL INPUT LEVEL-SHIFTER

CLAIM OF PRIORITY

This United States continuation patent application is related to, and claims priority to, U.S. patent application Ser. No. 14/884,451, filed Oct. 15, 2015, which claims priority to U.S. patent application No. 14/606,942, filed on Jan. 27, 2015, now issued as U.S. Pat. No. 9,208,860, on Dec. 8, 2015, and to U.S. patent application Ser. No. 13/976,326, filed on Nov. 21, 2013, now issued as U.S. Pat. No. 8,971,097 on Mar. 3, 2015, which is a 371 application of, and claims priority to PCT Patent Application No. PCT/US12/71714, filed on Dec. 27, 2012, and which the entire contents of which are also incorporated herein by reference.

BACKGROUND

Low power operation of Very-Large-Scale Integration (VLSI) circuits is becoming essential for saving power in current and future processors. Furthermore, power efficiency has become one of the primary competitive metrics for System-On-Chip (SOC) designs in computer, processor, cell-phone, tablet, micro-server and net-book markets. However, it is becoming increasingly challenging to lower the dynamic power consumption for nano-scale process technology based processors (e.g., sub 22-nm) due to higher intrinsic device variations (e.g., variations in effective channel length Le and threshold voltage Vt of a transistor) and sensitivity to defects that cause failures at low voltages.

SOC designs are also becoming increasingly desirable and competitive in the cell phone, tablet, micro-server and net-book market spaces. However, due to the complexity of various functional units on SOC designs, and challenging tradeoff of power versus performance, global power supply (Vcc) SOC rail voltage can vary vastly from SOC design to design. This variation in Vcc poses several challenges for circuits e.g., Static Random Access Memory (SRAM) and other memory designs.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 3 is a layout of a traditional SRAM array.

FIG. 4 is a layout of a SRAM array using segmentation for lowering dynamic power and peak current, according to one embodiment of the disclosure.

DETAILED DESCRIPTION

Figure 1:
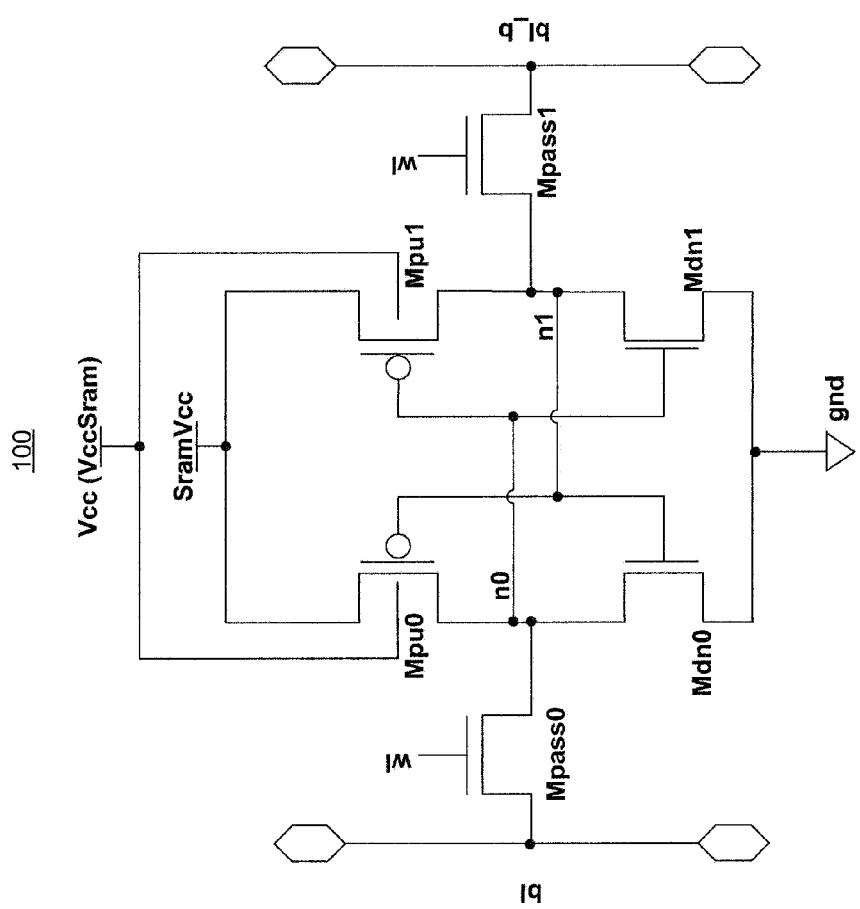
FIG. 1 is a 6T SRAM cell with at least two power supplies for improving write operation.

The embodiments describe an apparatus comprising a plurality of memory arrays, local write assist logic units, and read/write local column multiplexers coupled together in a group such that area occupied by the local write assist logic units and the read/write local column multiplexers in the group is smaller than it would be when global write assist logic units and the read/write global column multiplexers are used. The embodiments enable read and write operations, for the plurality of memory arrays, at lower power with a smaller area impact, than traditional plurality of memory arrays, in the presence of device variation.

The embodiments also describe a level-shifter comprising: a first power supply to power a plurality of transistors of the level-shifter; a first input node to receive a first signal generated by a circuit operating on a second power supply, the second supply being different than the first power supply; a first n-type transistor to receive the first signal; a second input node to receive a second signal, which is an inverse of the first signal, the second signal generated by the circuit; and a second n-type transistor to receive the second signal, the first and second n-type transistors having drain terminals cross-coupled to some of the plurality of transistors.

The embodiments further describe an apparatus comprising: a write assist pulse generator operating on a first power supply; one or more pull-up devices coupled to the write assist pulse generator, the one or more pull-up devices operating on a second power supply different from the first power supply; and an output node to provide power supply to a memory cell.

In the following embodiments: Vcc is the same as VccSram (which may be a specific SramVcc power rail); SramVcc is the local Vcc from a write-assist circuit block; and Vnn is SOC power rail (i.e., power rail used on rest of the chip or processor). Input/output signals for the SRAM are generally on Vnn. In one embodiment, signals on Vnn are level-shifted to VccSram, and signals on VccSram are level-shifted to Vnn.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a", "an", and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The terms "substantially," "close," "approximately," "near," "about," generally refer to being within +/−20% of a target value.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors may also include Tri-Gate and FinFet transistors. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates a n-type transistor (e.g., NMOS, NPN BJT, etc.) and the term "MP" indicates a p-type transistor (e.g., PMOS, PNP BJT, etc.).

FIG. 1 is a 6T SRAM cell 100 with at least two power supplies for improving write operation. The SRAM cell 100 comprises two access n-type devices Mpass0 and Mpass1 for read/write operations. The two access n-type devices Mpass0 and Mpass1 are controllable by word-line (wl) signals. The SRAM cell 100 further includes two cross-coupled inverters that hold the memory cell state (or data). The first inverter of the two cross-coupled inverters is formed by p-type Mpu0 and n-type Mdn0 devices, while the second inverter of the cross-coupled inverters is formed from p-type Mpu1 and n-type Mdn1 devices. The output node n0 of the first inverter is coupled to access device Mpass0 and to the input of the second inverter. The output node n1 of the second inverter is coupled to access device Mpass1 and input of the first inverter. The access devices Mpass1 and Mpass0 are also coupled to bit-line signals bl and bl_b (inverse of bl). In one embodiment, the body or bulk terminals of the p-type devices Mpu0 and Mpu1 (of the first and second inverters) is coupled to SramVcc which is different from VccSram While FIG. 1 illustrates two power supplies, VccSram and SramVcc, typical SRAM cells operate on a single power supply VccSram (i.e., SramVcc node is shorted to Vcc). In a typical application of the SRAM cell 100, write data and data_b (which is inverse of data) are driven through bit-line signals bl and bl_b (inverse of bl) respectively. During write operation, data is driven into the SRAM memory cell 100 with word-line wl, which is set at Vcc level (logical high level). Since the n-type access devices Mpass0 and Mpass1 do not pass a strong HIGH (i.e., a logical high level), the typical SRAM cell 100 struggles to write a '1' when Vcc is lowered. This effect is even more pronounced at lower Vcc since Vt of the access n-type devices Mpass0 and Mpass1 does not scale with the supply voltage Vcc. When device variations (e.g., variations in Le and Vt) are considered in conjunction with lower Vcc operation, the typical SRAM cell 100 becomes susceptible to write failure (i.e., the typical SRAM cell 100 cannot flip the internal nodes n0/n1). Such failure contributes to significant yield loss at lower Vcc levels.

The above stated problem (and other problems) are overcome by providing a separate power supply (e.g., Vcc) for the bulk/body of p-type devices Mpu0 and Mpu1 while providing a different power supply (e.g., SramVcc) for logical operation of the cross-coupled inverters. The SramVcc is lowered during write operation to reduce the strength of Mpu0 and Mpu1 devices. SramVcc is generated by special circuits e.g., FIG. 2.

Figure 2:
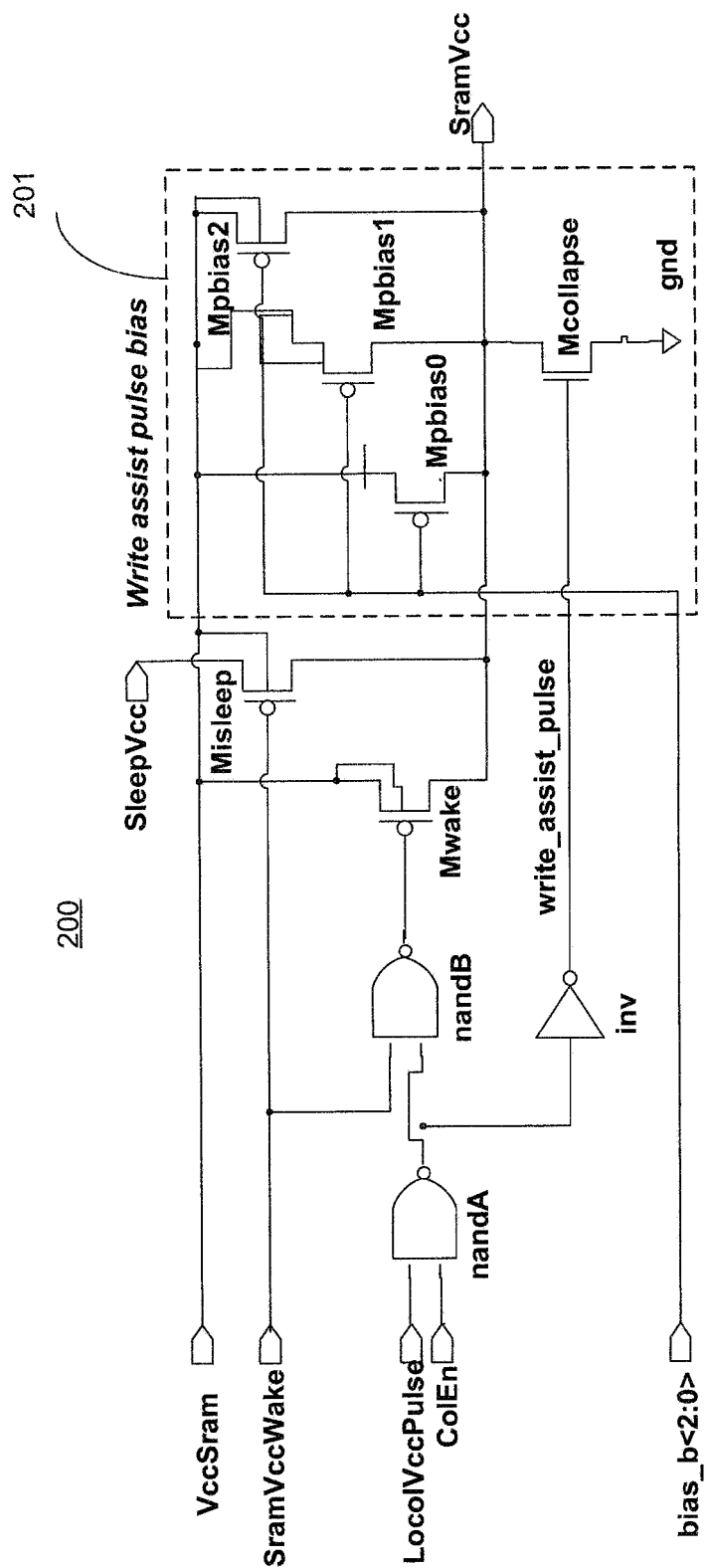
FIG. 2 is a circuit for generating SramVcc for write assist during write operation of a SRAM array.

FIG. 2 is a circuit 200 for generating SramVcc for write assist during write operation of a SRAM array. FIG. 2 is described with reference to FIG. 1. The write assist circuit 200 comprises a write assist pulse bias circuit 201 that adjusts the level of SramVcc during write and read operations of a SRAM array having the SRAM cell 100. SramVcc is lowered by activating Mcollapse (n-type device) by the write_assist_pulse signal generated by the combinational logic including inverter inv and NAND gate nandA. The speed and level of collapse (or reduction) of SramVcc level can be programmed by Mpbias0, Mpbias1, and Mpbias2 devices which are controllable by digital signal bias_b<2:0>(i.e., three bits of bias_b signal). SramVccWake signal determines the SRAM sleep (low power) or wake (normal operation) modes by controlling Misleep and Mwake (via NAND gate nandB) devices. If in sleep mode, SramVcc is tied to a specific sleep voltage that is lower than the normal operation SramVcc. SleepVcc is the power supply for Misleep. LocolVccPulse signal is generated by SRAM control/timer (not shown) and determines the length duration of the Mcollapse write assist pull-down. ColEn allows for write-byte and writebit functionality (e.g., ColEn allows to only write to 8 bits out of a 64 for bit design).

SRAM cell 100 is laid out in an array of SRAM cells. As mentioned above, as process technologies shrink (or scale down), the array of SRAM cells no longer has enough read and write margins at typical power supply (Vcc) operating voltages unless special circuits (e.g., write assist circuit 200 of FIG. 2) are used to assist read and write operations. The addition of special circuits (e.g., write assist circuit 200 of FIG. 2) for providing assistance to write and read operations increase power and area for the 6T SRAM array design. An increase in power and area for the SRAM array presents a problem for making low-power mobile processors and SOCs. The increase in power arises from Mpbias0, Mpbias1, Mpbias2, and Mcollapse devices.

FIG. 3 is a layout 300 of a traditional SRAM array. The layout 300 comprises arrays of SRAM cells in large blocks (e.g., 256×4) 301a and 301b which require corresponding large size write assist circuits (e.g., write assist circuit 200 of FIGS. 2) 302a and 302b, and corresponding read/write (RD/WR) column multiplexers 303a and 303b, respectively. Layout 300 also includes sense amplifier and latch circuit 304 and write driver 305, which are coupled to the read/write (RD/WR) column multiplexers 303a and 303b via 306a, 306b, 307a, and 307b (also called global RD/WR column multiplexers because they are global to the array of SRAMs). Because of the large arrays of SRAM cells (e.g., 256×4) 301a and 301b, SramVcc routing 308a and 308b is designed to carry enough power supply for the large arrays of SRAM cells 301a and 301b.

The increase in SRAM write dynamic power caused by the devices of FIG. 2 negatively impacts the overall SOC design complexity and cost. For example, the requirement for power delivery for the SRAM array is increased significantly over same rail based sub array design solution because SramVcc and VccSram are now provided to the SRAM cells in the SRAM array. Current delivery requirement for the SRAM voltage-regulator keeps on increasing as more SRAMs are added to the SRAM arrays 301a and 301b for performance enhancements. An increase in current delivery requirement negatively impacts the platform cost. Providing two separate power supplies also increases the magnitude of peak current for the SRAM voltage rails SramVcc 308a and 308b.

For example, the peak current for the SRAM voltage rails SramVcc 308a and 308b may increase by 3×-4× (where 'X' refers to number of times) over single power supply based SRAM architectures. An increase in peak current magnitude results in costly packaging solutions (e.g., multiple die-side capacitors) and placement of on-die capacitor for the SRAM rail. Providing two separate power supplies also increases the magnitude of voltage droop on VccSram and SramVcc nodes. The above problems and others are addressed by the embodiment of FIG. 4.

FIG. 4 is a layout 400 of a SRAM array using segmentation for lowering dynamic power and peak current, according to one embodiment of the disclosure. It is pointed out that those elements of FIG. 4 having the same reference numbers (or names) as the elements of any other figure can operate or function in any manner similar to that described, but are not limited to such.

Layout 400 comprises SRAM array cells which are segmented into 401a, 401b, 401c, and 401d sub arrays. For example, 256×4 array 301a is segmented into four 64×4 sub arrays including arrays 401a and 401b, where each of the four 64×4 sub arrays (e.g., 401a and 401b) is smaller in size (i.e., area) than the 256×4 array 301a. Similarly, in this example, 256×4 array 301b is segmented into four 64×4 sub arrays including 401c and 401d, where each of the four 64×4 sub arrays (e.g., 401c and 401d) is smaller in size (i.e., area) than the 256×4 array 301b. While the embodiment illustrates segmenting 256×4 arrays into four sub segments, any number of sub segments may be devised to achieve the technical results discussed. For example, array granularities of 64×4, 32×4, 16×4, etc. may be used for segmenting the larger array (e.g., array of 256×4).

Layout 400 further comprises write assist circuits 402a, 402b, 402c, and 402d, which are segmented version of write assist circuits 302a and 302b. For example, write assist circuit 302a is segmented into two write assist circuits 402a, 402b, where each write assist circuits 402a and 402b are smaller in size (area) than write assist circuit 302a. In another example, write assist circuit 302b is segmented into two write assist circuits 402c and 402d, where each write assist circuits 402c and 402d are smaller in size (area) than write assist circuit 302b. In other embodiments, write assist circuits 302a and 302b may be segmented into more than two write assist circuits.

Since write assist circuits 402a, 402b, 402c, and 402d (also called local write assist circuits because they are local to the segmented array of SRAMs) are downsized relative to write assist circuits 302a and 302b, RD/WR local column multiplexers 403a, 403b, 403c, and 403d of layout 400 are downsized relative to RD/WR column multiplexers 303a and 303b when RD/WR column multiplexers 303a and 303b are segmented. By segmenting array 301a and write assist circuit 302a, each SramVcc 408a and 408b has shorter routing length than the routing length of SramVcc 308a, according to one embodiment. By segmenting array 301b and write assist circuit 302b, each SramVcc 408c and 408d has shorter routing length than the routing length of SramVcc 308b, according to one embodiment.

In one embodiment, read data and write data (and their inverse signals) 406a, 406b, and 407a, 407b, respectively, are routed to and from the RD/WR local column multiplexers 403a, 403b, 403c, 403d (also called RD/WR local column multiplexers because they are local to the segmented array of SRAMs) to the sense amplifier and latch 404. In such an embodiment, pass-gates are coupled to the routings of 406a, 406b, and 407a, 407b to couple the read data and write data (and their inverse signals) to the respective RD/WR local column multiplexers 403a, 403b, 403c and 403d. In one embodiment, sense amplifier and latch 404 is substantially the same size as sense amplifier and latch 304. In other embodiments, sense amplifier and latch 404 is smaller in size relative to sense amplifier and latch 304. In one embodiment, write driver 405 is substantially the same size as write driver 305. In other embodiments, write driver 405 is smaller in size relative to write driver 305.

The embodiment of FIG. 4 addresses the write assist high power problem of FIG. 3 by segmenting the bit-cell array elements into sets of smaller sub arrays e.g., 64×4 (64 bit -cells per '4' columns). To explain the embodiments, the example of 256×4 array which is segmented into 64×4 sub arrays is described. However, other sizes for segmentation may be used without changing the essence of the embodiments.

In this example, segmentation of layout 300 of FIG. 3 results in SramVcc, bl, and bl_b (FIG. 1, FIG. 2) signals being segmented every 64 bit-cells as well. The write assist circuit of FIG. 3 was sized to support a 256×4 bit-cell array. In one embodiment, by segmenting the array down to 64×4, write assist circuit can be downsized (i.e., active area and/or footprint can be reduced). For example, write assist circuit can be downsized up to 70%, to achieve the same performance as the previous write assist circuit. FIG. 3 uses a large (in terms of active area) write assist circuit (compared to write assist circuit of FIG. 4) connected to a large 256×4 array. Therefore, SramVcc 301a, bl, and bl_b are continuous across 256 bit-cells. The embodiment of FIG. 4 shows a block level diagram of the array read and write scheme. The embodiment of FIG. 4 uses a smaller write assist circuit (compared to write assist circuit of FIG. 3) coupled to a smaller 64×4 array. Therefore, SramVcc (408a-d), bl, and bl_b are localized and continuous across only 64 bit-cells.

Layout 400 reduces peak and average current (e.g., required during write process) by segmenting layout 300 of FIG. 3 into smaller portions with smaller write assist circuits (smaller versions of FIG. 2), and read/write column select circuits. One technical effect for segmenting layout 300 of FIG. 3 into layout 400 of FIG. 4 is that dynamic write power savings are realized, for example, more than 50% power savings. Other costs such as cost of large voltage regulator, number and size of packaging capacitors on SramVcc is also reduced by the embodiment of FIG. 4. The embodiment of FIG. 4 also allows for integration of smaller bit cells into the memory unit. The embodiment enables read and write operations for the plurality of memory arrays at lower power with a smaller area impact, than traditional plurality of memory arrays in the presence of device variation.

The embodiment of FIG. 4 combines a new segmented layout topology with modified write assist and read/write column select circuits. Many technical effects are exhibited by the embodiment of FIG. 4. Some non-limiting technical effects are that the embodiment of FIG. 4 reduces dynamic write power compared to the embodiment of FIG. 3 by downsizing select components of write assist circuits (e.g., component 201). In one embodiment, downsizing of select components of write assist circuits is possible due to segmentation of the bit-cell array.

Another technical effect of the embodiment of FIG. 4 is that it reduces dynamic read and write power compared to the embodiment of FIG. 3. This is done by segmenting the local bit-lines from the global read and write lines coupled to the sense-amplifier and latch 404. This in turn lowers the total capacitance on the global read and write lines that is switching during read and write operations. Another technical effect of the embodiments is that layout 400 reduces peak current by downsizing bit-line pre-charge and write assist components (e.g., component 201 and its corresponding drivers). The embodiment of layout 400 also minimizes bit-line mismatches by having minimum fixed number (e.g., 64) of bit-cells per bit-line. The embodiment of layout 400 also enables up to, for example, 1024×4 bit-cells per bank. Previous designs only support up to, for example, 512×4 cells per bank.

Figure 5:
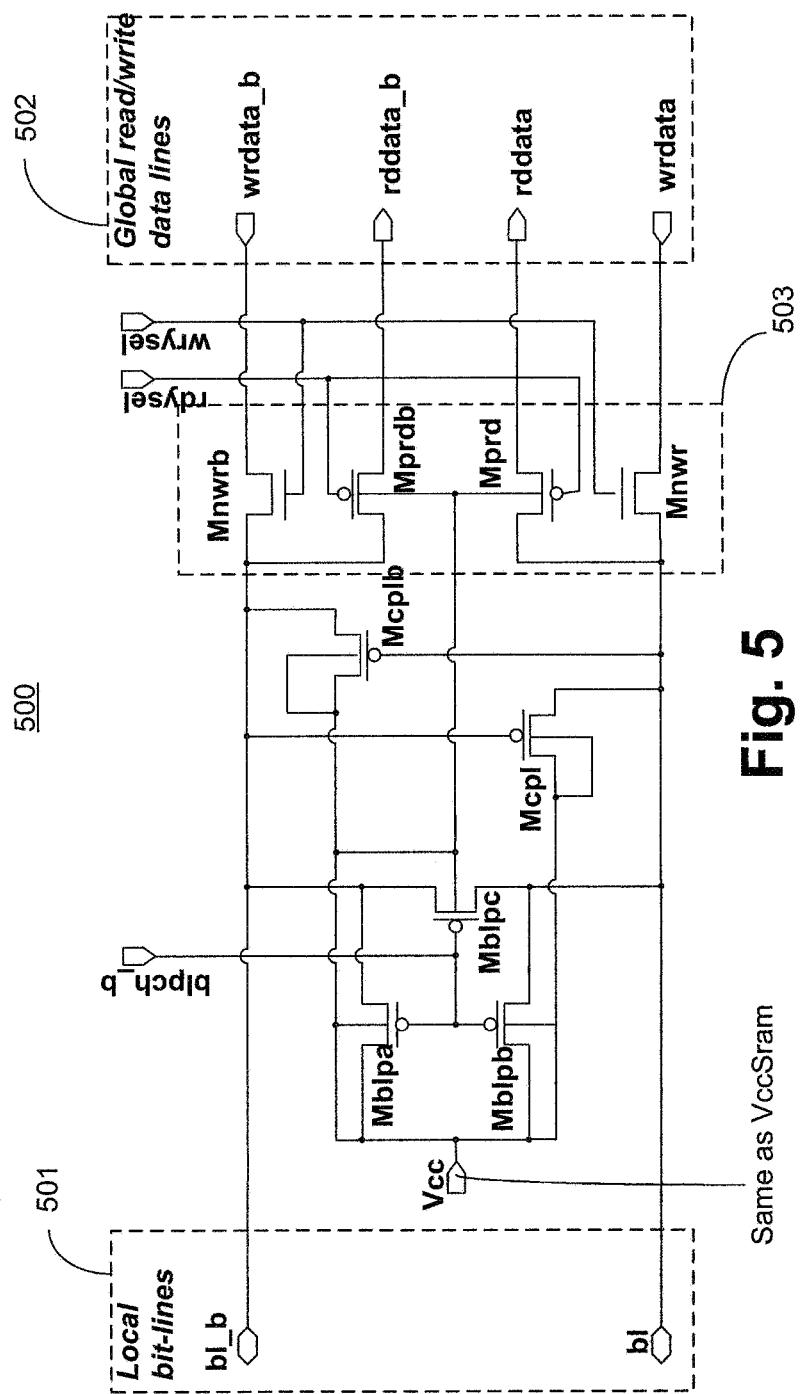
FIG. 5 is a read/write column select and bit-line pre-charge circuit for the segmented SRAM array of FIG. 4, according to one embodiment of the disclosure.

FIG. 5 is a read/write column select and bit-line pre-charge circuit 500 for the segmented SRAM array of FIG. 4, according to one embodiment of the disclosure. It is pointed out that those elements of FIG. 5 having the same reference numbers (or names) as the elements of any other figure can operate or function in any manner similar to that described, but are not limited to such.

Read/write column select and bit-line pre-charge circuit 500 (e.g., 403a-d) comprises local bit-lines 501 bl and bl_b (inverse of bl) and global read/write data lines 502—wrdata, wrdata_b, rddata, and rddata_b which correspond to 407a-b and 406a-b respectively. In one embodiment, local bit-lines 501 are generated by the circuit including transistors Mblpa, Mblpb, Mblpc, Mcpl, Mcplb, and pass-gates 503 including Mnwrb, Mprdb, Mprd, and Mnwr. blpch_b is the local bl (local bit-line) pre-charge signal which pre-charges local bl-lines (local bit-lines) 501 to VccSram before any read/write operations. During a read operation, rdysel signal acts as the read column multiplexer select signal which allows the value of local bl-lines 501 to propagate to the global read data lines (rddata & rddata_b). During a write operation, wrysel signal acts as the write column multiplexer select signal which allows write data on global write data lines (wrdata & writedata_b) to pass to the local bl-lines 501.

Referring to the exemplary embodiment of FIG. 4, every 64×4 segment of bit-cells (4019a-d) is coupled to a local read/write select circuit 500 (e.g., 403a-d). In one embodiment, during read and write operations, the locally selected bl and bl_b are read from or written to through pass-gates 503—Mnwr, Mnwrb, Mprd, and Mprdb. In one embodiment, the cross-coupled devices Mcpl and Mcplb negate the need for complementary pass-gates since during a write operation, the mechanism will pull-up the bit-line with a '1.' In this embodiment, lower capacitance (64×4 memory cells instead of 256×4 memory cells) on global read/write data lines 502 results in a reduction of average and peak current during read and write operations.

Figure 6:
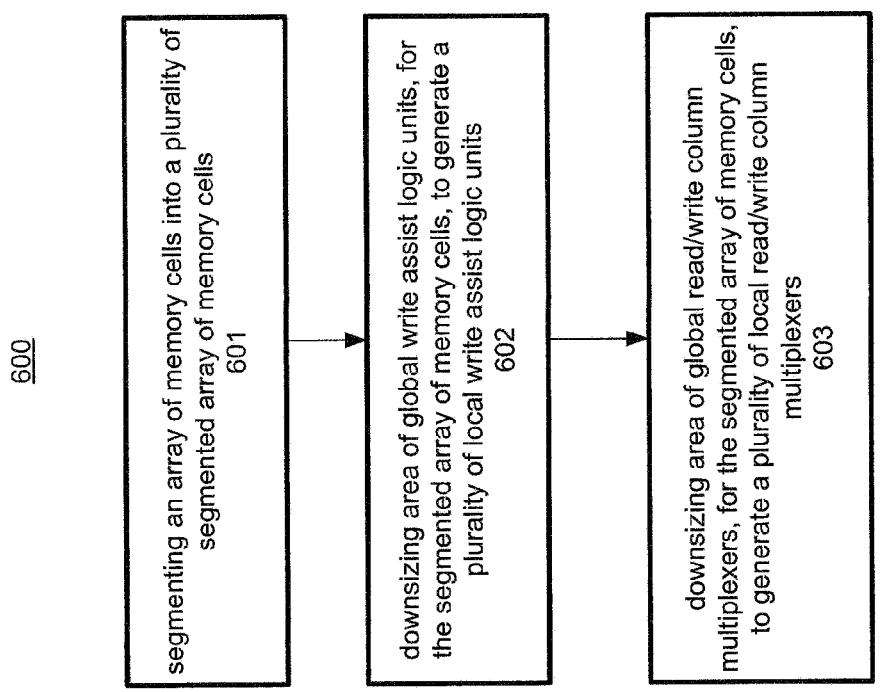
FIG. 6 is a method for layout segmentation of a SRAM array lowering dynamic power and peak current, according to one embodiment of the disclosure.

FIG. 6 is a method 600 for layout segmentation of a SRAM array for lowering dynamic power and peak current, according to one embodiment of the disclosure. It is pointed out that those elements of FIG. 6 having the same reference numbers (or names) as the elements of any other figure can operate or function in any manner similar to that described, but are not limited to such. Although the blocks in the flowchart with reference to FIG. 6 are shown in a particular order, the order of the actions can be modified. Thus, the illustrated embodiments can be performed in a different order, and some actions/blocks may be performed in parallel. The flowchart of FIG. 6 is illustrated with reference to the embodiments of FIGS. 4-5. Some of the blocks and/or operations listed in FIG. 6 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 601, an array of memory cells (e.g., 301a-b) is segmented into a plurality of segmented array of memory cells (e.g., 401a-d). At block 602, area of global write assist logic units (e.g., 302a-b) is downsized, for the segmented array of memory cells, to generate a plurality of local write assist logic units (e.g., 402a-d), wherein each of the local write assist logic units in the plurality of local write assist logic units (e.g., 402a-d) is coupled to each of the segmented array of memory cells of the plurality of segmented array of memory cells (e.g., 401a-d).

At block 603, area of global read/write column multiplexers (e.g., 303a-b) is downsized, for the segmented array of memory cells (e.g., 401a-d), to generate a plurality of read/write local column multiplexers (e.g., 403a-d). In one embodiment, each of the read/write local column multiplexers is coupled to each of the segmented array of memory cells of the plurality of segmented array of memory cells. In one embodiment, downsizing area of global write assist logic units (e.g., 302a-b) comprises reducing size of the pull-up p-type transistors (e.g., Mpbias0, Mpbias1, and Mpbias2) of the global write assist logic units to generate local pull-up p-type transistors for the local write assist logic units (e.g., 402a-d).

Figure 7:
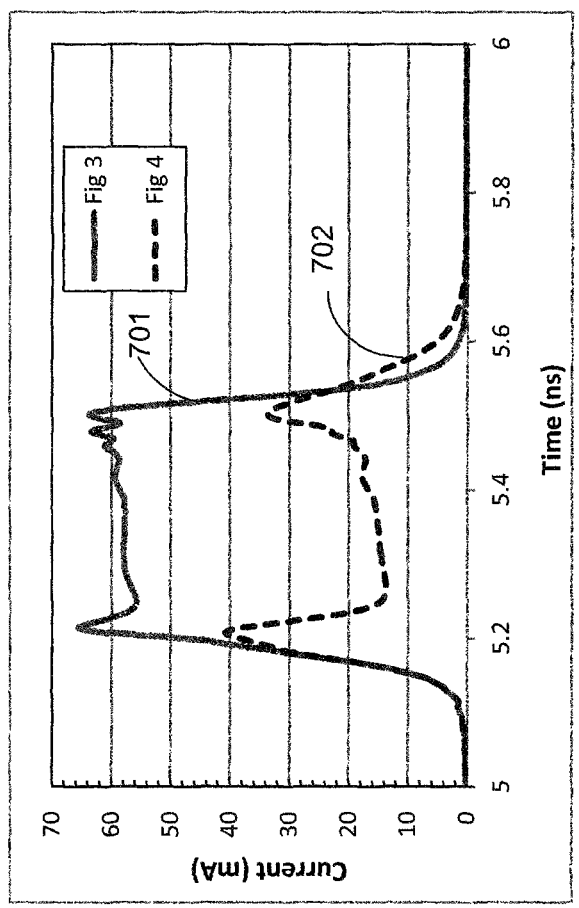
FIG. 7 is a plot with waveforms illustrating power savings from segmenting SRAM arrays compared to traditional SRAM arrays of FIG. 3, according to one embodiment of the disclosure.

FIG. 7 is a plot 700 with waveforms illustrating the power savings from segmenting SRAM array compared to traditional SRAM array of FIG. 3, according to one embodiment of the disclosure. The x-axis is time (in nanoseconds) while y-axis is current (in mA). In this exemplary plot, waveform 701 (sold curve) is the peak current for the embodiment of FIG. 3 while waveform 702 (dotted curve) is the peak current for the embodiment of FIG. 4. For the same process technology, segmentation discussed in the embodiments results in significant power savings because the peak current between the embodiments of FIG. 3 and FIG. 4 reduces.

The embodiments lower the dynamic power of SRAM arrays which is valuable for processors and SOC with memory arrays. As device geometries shrink (or scale), Le and Vt variations in transistors are expected to get worse and the conventional design using contention circuits may be undesirably high in write-power and may consume more area versus previous technology nodes. The embodiments segment SramVcc and BL (bit-line or bl), which provides dynamic power savings. The embodiments reduce peak current by more than half over traditional SRAM designs.

For SOC applications with many SRAMs toggling at the same time, a high peak current is problematic in terms of voltage droop on the supply rails. The embodiments reduce the voltage droop on the SramVcc supply rail, which has much less capacitance than the main SOC Vnn rail. The embodiments improve BL mismatches significantly since there is always a fixed number (e.g., 64) of bit-cells on the BL regardless of the array size ranging from 2 Kbyte to 64 Kbyte, for example. The embodiments provide a modular design that is suitable for SRAM compiler which can easily generate from 256 to 8192 depth by 4 Byte data bandwidth SRAMs, for example.

Figure 8:
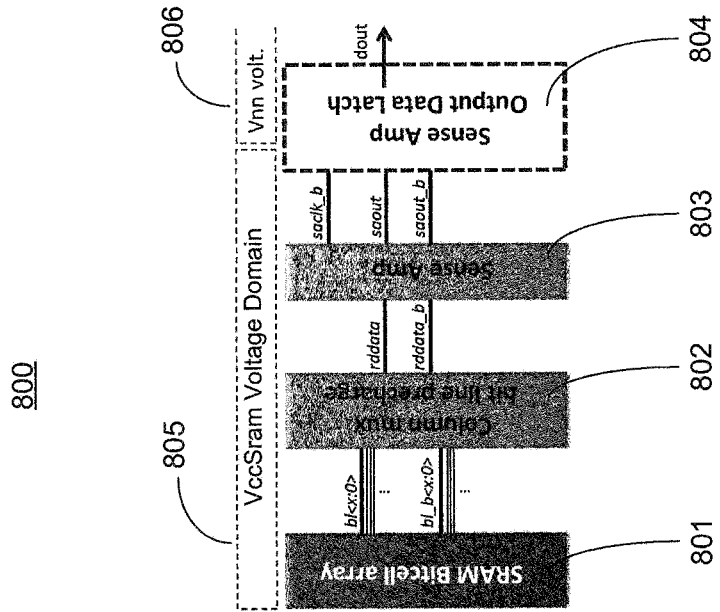
FIG. 8 is memory array architecture with 6T SRAM cells and sense amplifier data output driver operating on a different power supply than the SRAM array.

FIG. 8 is SRAM array with sense amplifier data output driver architecture 800 operating on a different power supply than the SRAM array. It is pointed out that those elements of FIG. 8 having the same reference numbers (or names) as the elements of any other figure can operate or function in any manner similar to that described, but are not limited to such.

The architecture 800 comprises an SRAM bit-cell array 801 (e.g., 301a-b and/or 401a-d), column multiplexer with bit-line pre-charge unit 802 (e.g., 303a-b and/or 403a-d), sense amplifier 803 (e.g., 304 and/or 404), and sense amplifier output data latch 804 (part of 304 and 404, for example). SRAM bit-cell array 801 (e.g., 301a-b and/or 401a-d), column multiplexer with bit-line pre-charge unit 802 (e.g., 303a-b and/or 403a-d), sense amplifier 803 (e.g., 304 and/or 404) operate on VccSram 805 voltage domain while sense amplifier output data latch (part of 304 and/or 404, for example) operates on Vnn (e.g., VccSOC) power supply 806 voltage domain which is different from VccSram power supply voltage domain.

SOC designs are becoming increasingly desirable and competitive in the cell phone, tablet, micro-server and netbook market spaces. However, due to the complexity of the various functional units on the chip and challenging tradeoff of power versus performance, the global VccSOC power rail (also called Vnn) voltage can vary vastly from SOC design to design. Furthermore, Vnn 806 voltage target can continue to change during the production life cycle. SOC's, SRAMs may have a dedicated power rail (VccSram) to insure that reliability and Vccmin requirements are met. The term "Vccmin" generally refers to minimum operating voltage at which the SRAM retains its data. The dedicated rail VccSram is used since Vnn rail voltage is typically too low (due to SOC low power requirements) to meet the SRAM Vccmin requirement. The terms "VccSram" and "Vcc" are interchangeably used, and mean the same voltages unless specified otherwise.

An example of a 6T SRAM used in SOC designs is shown in FIG. 1. Traditional sense amplifier output data latch 804 operates on Vnn 806 which is below the VccSram rail 805. During SRAM read operation, output data is level-shifted down to Vnn domain 806 which the rest of the processor uses. SRAM architecture 800 illustrates the read process where a bit-line is selected for read, multiplexed to rddata lines, where a sense amplifier 803 then outputs a 1 or 0 state on saout to the sense amplifier output data latch 804. The data is then level-shifted to the Vnn domain on dout.

Figure 9:
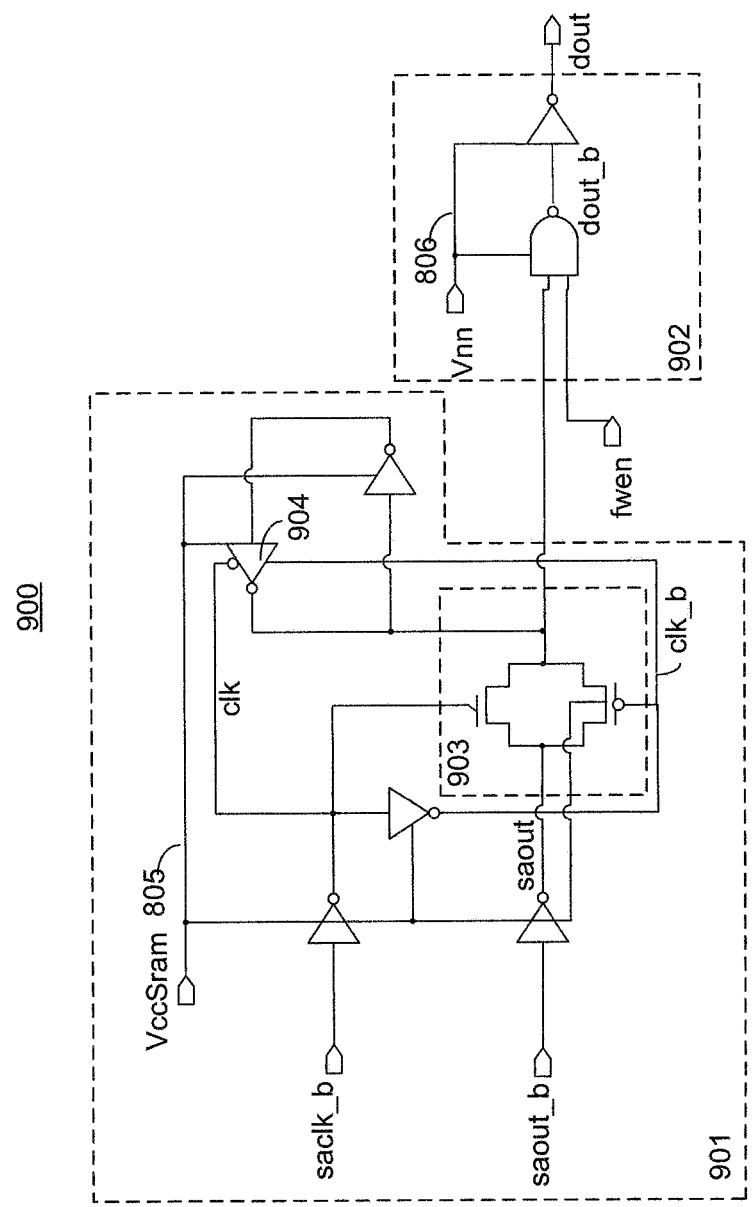
FIG. 9 is a sense amplifier data output driver and latch.

FIG. 9 is a circuit 900 with sense amplifier data output driver and latch. Circuit 900 comprises a latch 901 coupled to the output driver 902, where latch 901 operates on VccSram 805 while output driver 902 operates on Vnn 806. Latch 901 comprises inverters, pass-gate 903, and keeper 904. Signal saout_b in circuit 900 is used to carry the appropriate data to the driver 902 which comprises a NAND gate and an output inverter on the Vnn domain 806. The output driver 902 generates the SRAM data output dout. Circuit 900 uses saclk_b (output latch clock) signal to latch saout_b on a rising edge of saclk_b. Circuit 900 also uses a keeper 904 on the output of the pass gate 903 to keep the latch value retained when the latch clock is off. The output may be firewalled (by fwen signal) to prevent short circuit current between voltage domains (806 and 805) when VccSram is collapsed (i.e., reduced) during power-gating (low power) operation but Vnn is still on and at the same level. In one embodiment, firewalling is used for power-off and power-gating modes and may not be related to write assist.

The NAND logic gate and inverter of 902 may not be a robust level-shifter design because read operation fails when Vnn is greater than VccSram voltage. For example, when a processor having SRAM arrays (and architecture) operates on a burst mode (or turbo mode), Vnn can be well above VccSram. However, circuit 900 may fail to operate properly when Vnn goes above VccSram because the output driver 902 may fail to operate properly. For example, during an IR voltage droop on VccSram (e.g., VccSram can drop from 1.05v to 0.94v) and a spike on Vnn (e.g., Vnn can rise to 1.25V), a functional failure can occur in circuit 900 because of the output driver 902.

Figure 10:
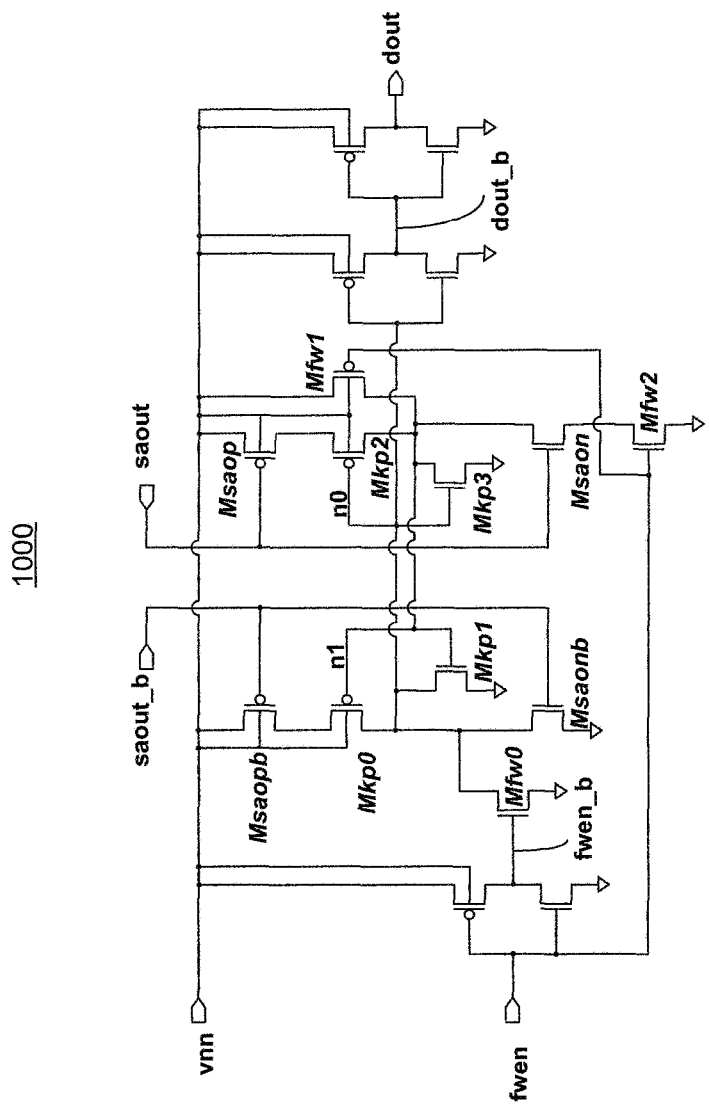
FIG. 10 is a dual input level-shifter with integrated latch to replace the sense amplifier data output driver and latch of FIG. 9, according to one embodiment of the disclosure.

FIG. 10 is a dual input level-shifter 1000 with integrated latch to replace the sense amplifier data output driver and latch 900 of FIG. 9, according to one embodiment of the disclosure. It is pointed out that those elements of FIG. 10 having the same reference numbers (or names) as the elements of any other figure can operate or function in any manner similar to that described, but are not limited to such. The embodiment of FIG. 10 provides a solution for SRAM data output dout to make it reliable across a wide range of SOC Vnn voltage targets.

In one embodiment, dual input level-shifter 1000 with integrated latch comprises dual input ports saout_b and saout, power supply Vnn, optional firewall enable signal port fwen, output port dout, p-type devices Msaopb, Msaop, Mfw1, Mkp0, and Mkp2, n-type devices Mkp1, Mkp3, Mfw0, Mfw2, Msaonb, and Msaon, and inverters or buffers to drive n0 as dout. In one embodiment, dual input level-shifter 1000 with integrated latch comprises a first power supply (Vnn) to power a plurality of transistors of the level-shifter including p-type devices Msaopb, Msaop, Mfw1, Mkp0, and Mkp2; n-type devices Mkp1 Mkp3, Mfw0, Mfw2, Msaonb and Msaon; and inverters or buffers to drive n0 as dout.

In one embodiment, dual input level-shifter 1000 with integrated latch comprises a first input node to receive a first signal (saout_b) generated by a circuit operating on a second power supply (VccSram), the second supply being different than the first power supply (Vnn). In one embodiment, dual input level-shifter 1000 with integrated latch comprises a first n-type transistor (Msaonb) to receive the first signal (saout_b). In one embodiment, dual input level-shifter 1000 with integrated latch comprises a second input node to receive a second signal (saout), which is an inverse of the first signal (saout_b), the second signal generated by the circuit (which is operating on SramVcc). In one embodiment, dual input level-shifter 1000 with integrated latch comprises a second n-type transistor (Msaon) to receive the second signal (saout), the first and second n-type transistors having drain terminals cross-coupled to some of the plurality of transistors.

For example, drain terminal of Msaonb (first n-type transistor) is coupled to Mfw0, Mkp1, Mkp0, Mkp2, Mkp3, and output inverter that generates dout_b. Drain terminal of Msaon (second n-type transistor) is coupled to Mfw1, Mkp2, Mkp3, Mkp1, and Mkp0 devices. In one embodiment, dual input level-shifter 1000 with integrated latch comprises an output node dout to generate an output dout signal according to the first and second signals (saout_b and saout). Unlike circuit 900, dual input level-shifter 1000 with integrated latch is asynchronous. In one embodiment, dual input level-shifter 1000 with integrated latch is independent of a clock signal.

In one embodiment, dual input level-shifter 1000 with integrated latch further comprises a third input node (fwen) coupled to some of the plurality of transistors (e.g., Mfw1, Mfw2, and inverter to generate fwen_b). In one embodiment, the third input node receives third signal (fwen signal) to generate a deterministic output. For example, when fwen signal is a logical high, Mfw2 turns on to provide a virtual ground to Msaon source terminal, fwen_b is a logical low which turns off Mfw0, and Mfw1 is also off. When fwen_b is a logical low, Mfw1 turns on to pull node n1 high (i.e., Vnn level) which turns on Mkp1 causing node n0 to turn low which turns on Mkp2. A logical low n0 causes the output buffer to generate a logical low dout signal.

In one embodiment, dual input level-shifter 1000 with integrated latch comprises an output node (dout) to generate an output signal (dout signal) according to the first (saout_b) and second (saout) signals or third (fwen) signal. In one embodiment, some of the plurality of transistors of dual input level-shifter 1000 operates as a latch. In one embodiment, dual input level-shifter 1000 with integrated latch operates properly when second power supply (SramVcc) is higher or lower than first power supply (Vnn).

In one embodiment, dual input level-shifter 1000 with integrated latch replaces circuit 900 and supports dual-rail design (i.e., VccSram and Vnn). In this embodiment, saout and saout_b inputs are on the VccSram voltage domain from the sense amplifier circuit (e.g., 803 of FIG. 8). In one embodiment, the remainder of the dual input level-shifter 1000 with integrated latch is on the Vnn domain. In one embodiment, Msaon, Msaonb, Msaop, and Msaopb devices set the state on nodes n1 and n0. In one embodiment, Mkp0-Mkp3 devices act as keepers for n0 and n1 nodes. In one embodiment, firewall mode operation (when fwen=0) is achieved by using Mfw0, Mfw1, and Mfw2 devices. In one embodiment, firewall mode operation guarantees that dout is '0' when fwen =0 (i.e., deterministic output on dout).

The embodiment of FIG. 10 has an integrated latch and so latch 902 and its associated clock is no longer needed because saout and saout_b signals are already qualified by the sense amplifier enable clock in the preceding sense amplifier circuit itself. In one embodiment, because saout and saout_b are already a function of the sense amplifier enable clock in the sense-amplifier circuit itself, and are both pre-charged low before read operation, saclk_b (e.g.: see 901 of FIG. 9) is not needed for the dual input level-shifter 1000 with integrated latch.

There are many non-exhaustive (non-limiting) technical effects of the embodiment of FIG. 10. The embodiment of FIG. 10 is a robust approach for outputting read data for SRAM (and other memory designs) across a challenging range of SOC power supply rails. SOC power supply rails can typically vary from 0.5V-1.3V, and VccSram rails can range from 0.7V-1.3V, for example. The embodiment of FIG. 10 provides robust level-shifting operation of output data. For example, dual-rail level-shifter 1000 can level-shift data (both low to high, and high to low) from VccSram to wide range of SOC power domains Vnn. The embodiment of FIG. 10 reduces complexity of circuit 900. For example, an output latch clock is not required to safely latch output read data with dual-rail level-shifter 1000. In one embodiment, dual-rail level-shifter 1000 takes advantage of both sense amplifier outputs (saout_b and saout) being pre-charged to latch the output data itself. Dual-rail level-shifter 1000 is area efficient because it includes in itself a level-shifter, firewall logic, and latch with minimal transistor count.

While the embodiment of FIG. 10 is illustrated for use in memory architecture to replace the embodiment of FIG. 9, dual input level-shifter with integrated latch 1000 can be used in any circuit that requires level shifting of signals from one power supply domain to another power supply domain. For example, dual input level-shifter can be used in input-output (I/O) buffers, clocking architectures, etc.

Figure 11:
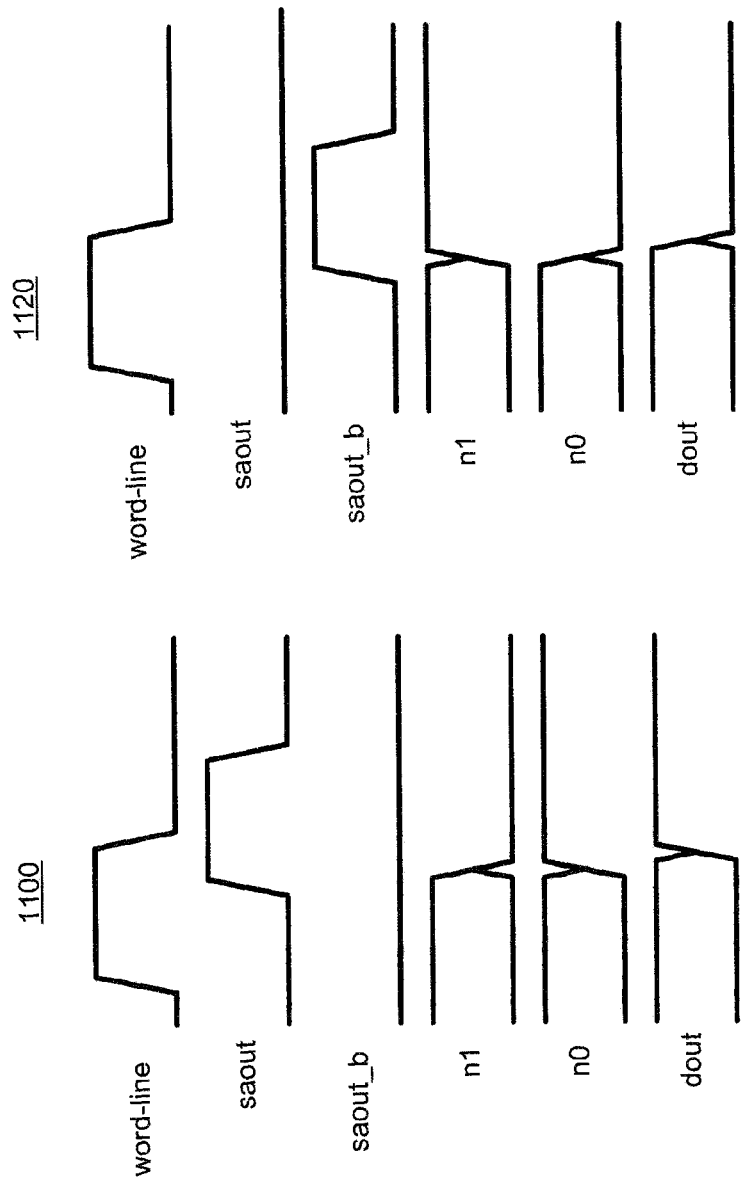
FIGS. 11A-B are timing diagrams associated with the dual input level -shifter with integrated latch of FIG. 10, according to one embodiment of the disclosure.

FIG. 11A-B are timing diagrams 1100 and 1120 associated with the dual input level-shifter with integrated latch of FIGS. 10, according to one embodiment of the disclosure. It is pointed out that those elements of FIGS. 11A-B having the same reference numbers (or names) as the elements of any other figure can operate or function in any manner similar to that described, but are not limited to such.

FIG. 11A illustrates the case when saout has a pulse and saout_b is logically low, while FIG. 11B illustrates the case when saout_b has a pulse and saout is logically low. Signal transitions on nodes n1, n0, and dout are illustrated. During a typical read operation for SRAM designs, the word-line is asserted high and is typically triggered from the SRAM reference clock (high or low). The sense-amplifier then senses the differential between bit-lines for the enabled row and then the sense-amplifier outputs saout or saout_b high to trigger the appropriate dout state.

Figure 12:
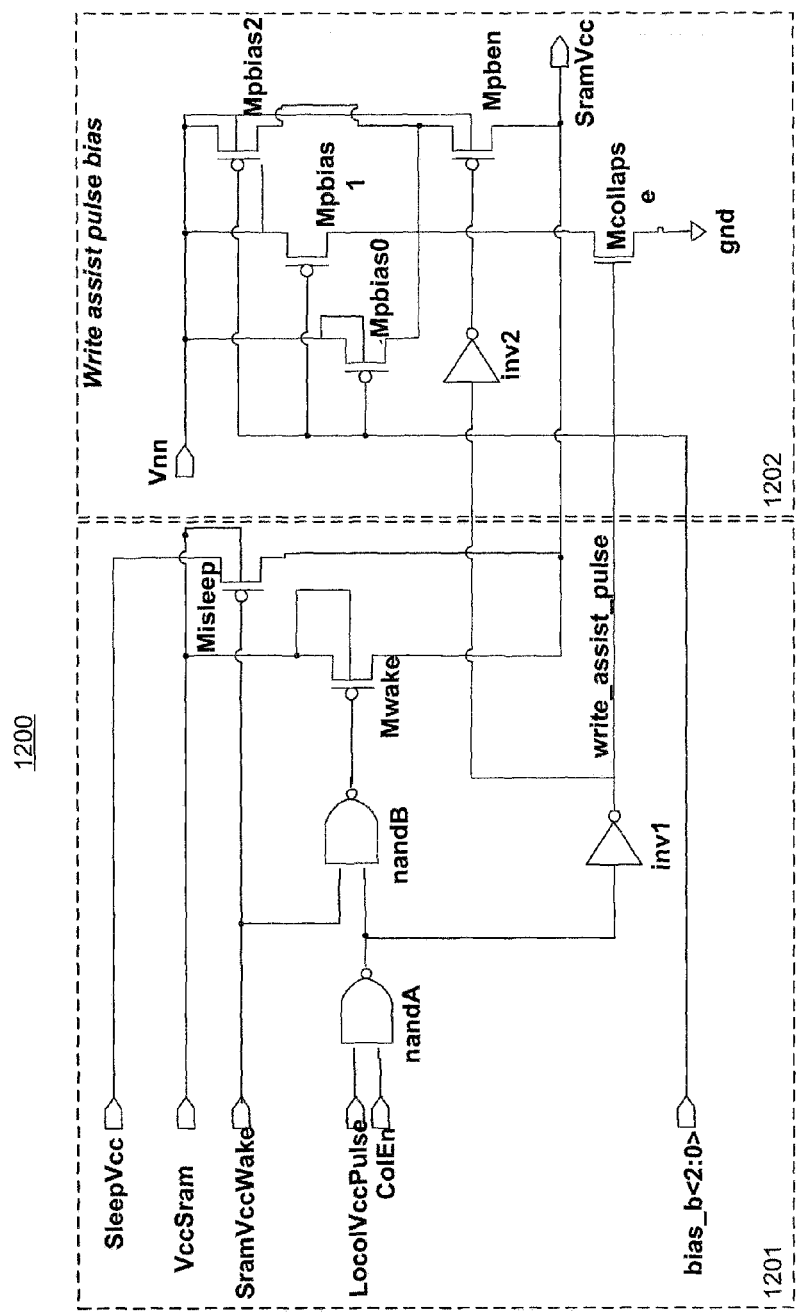
FIG. 12 is a dual-rail write assist circuit for reducing dynamic power and peak current, according to one embodiment of the disclosure.

FIG. 12 is a dual-rail write assist circuit 1200 for reducing dynamic power and peak current, according to one embodiment of the disclosure. It is pointed out that those elements of FIG. 12 having the same reference numbers (or names) as the elements of any other figure can operate or function in any manner similar to that described, but are not limited to such.

As mentioned with reference to FIG. 1, to overcome write-operation failure in the presence of device variations, the method currently used to assist write operation is to lower the memory cell SramVcc during write operation. Lowering SramVcc is done to reduce the fighting strength of Mdn0 and Mdn1 devices inside the memory cell 100. An example of write assist circuit (WRA) is shown in FIG. 2. The SramVcc rail is lowered by activating the Mcollapse n-type device. The speed and level of the collapse (or reduction) of SramVcc can be programmed by activating Mpbias0-Mpbias2 devices. The write assist circuit of FIG. 2 consumes extra power. The extra power primarily arises from temporary short-circuit through the Mpbias0-Mpbias2 devices and Mcollapse device.

While higher dynamic power for caches like the L2 (level-2 cache) may be acceptable due to lower activity and fewer parallel accesses (e.g., 8/64 get accessed), such is not the case for SOCs designed for handheld products such as tablets and smart-devices (e.g., smart-phones). In such SOC designs, it is quite common that 40-50 sub-arrays of memory are accessed simultaneously. For example, during high usage conditions, video play back mode, several SRAM blocks can have extensive parallel SRAM accesses. One implication of such parallel SRAM access is significant increase in both the average and peak power for SramVcc rail, primarily due to writing the bit-cell all the way to this higher voltage rail.

The increase in SRAM write dynamic power may implicate the overall SOC design complexity and cost. For example, requirement for power delivery for the SRAM increases over single-rail based sub-array design solutions. The current/power delivery requirement for the SRAM voltage-regulator keeps on increasing due to excessive usage of on-die SRAM for performance, and directly impacts the platform cost. SOC design complexity and cost may also increase because magnitude of the peak current for the SRAM voltage rail increases by 3×-4×, requiring costly packaging solutions (i.e. multiple die-side cap) and on-die cap solutions for the SRAM rail—both of these solutions add to integration complexity, and contribute to wafer and package level costs. SOC design complexity and cost may also increase because magnitude of voltage droop on the SramVcc rail (from write assist) may be significant and may force SRAM accesses below the active Vccmin of the technology for the particular bit-cell. As a result, a larger SRAM bit-cell may be required and the benefit of a fixed-rail is compromised.

The embodiment of FIG. 12 addresses the above SRAM power delivery challenges by reducing peak and average current required during the write process. The embodiment of FIG. 12 is similar to the embodiment of FIG. 2 except, among other differences, the write assist pulse bias section 1202 operates on Vnn power supply while the logic 1201 that generates the write_assist_pulse operates on VccSram, which is different from Vnn.

The embodiment of dual-rail write assist circuit 1200 addresses SOC SRAM power delivery challenges arising from high write power by taking advantage of the availability of the SOC "Vnn" rail that operates at lower voltage as compared to the VccSram rail. In one embodiment, with dual-rail write assist circuit 1200, bit-cells, sense-amplifiers and pre-charge circuitries may be placed on the higher VccSram voltage rail (e.g., 1.0V-1.05V) and interface logic may be placed on the variable SOC rail (Vnn) that can operate at the product minimum operating voltage (e.g., 0.7V).

The write assist problem of high power consumption is addressed by splitting the write assist circuit into VccSram (e.g., 1.05 V) and Vnn (e.g., 0.7 V) voltage domain portions 1201 and 1202 respectively, according to one embodiment. In one embodiment, Mpben and Mcollapse devices of 1202 are used to enable the initial write assist SramVcc drop. In one embodiment, Mpbias0-Mpbias2 devices of 1202 are on the Vnn rail and determine to what voltage level the SramVcc rail drops.

In one embodiment, after initial SramVcc drop, Mpben and Mcollapse devices are shut off, Mwake is activated, and SramVcc is pulled up to VccSram (e.g., 1.05V). In one embodiment, inverter inv2 prevents the case of only the Mcollapse device being active which can drop SramVcc rail too fast over a small delay window. In one embodiment, SramVccWake signal determines the SRAM sleep (low power) or wake (normal operation) modes. If in sleep mode, SramVcc is tied to a specific sleep voltage that is lower than the normal operational voltage SramVcc. In one embodiment, LocolVccPulse signal is generated by a SRAM control/timer (not shown) and determines the length duration of the Mcollapse write assist pull-down. In one embodiment, ColEn signal allows for writebyte and writebit functionality (e.g., ColEn signal allows to only write to 8 bits out of a 64 for bit design).

Figure 13:
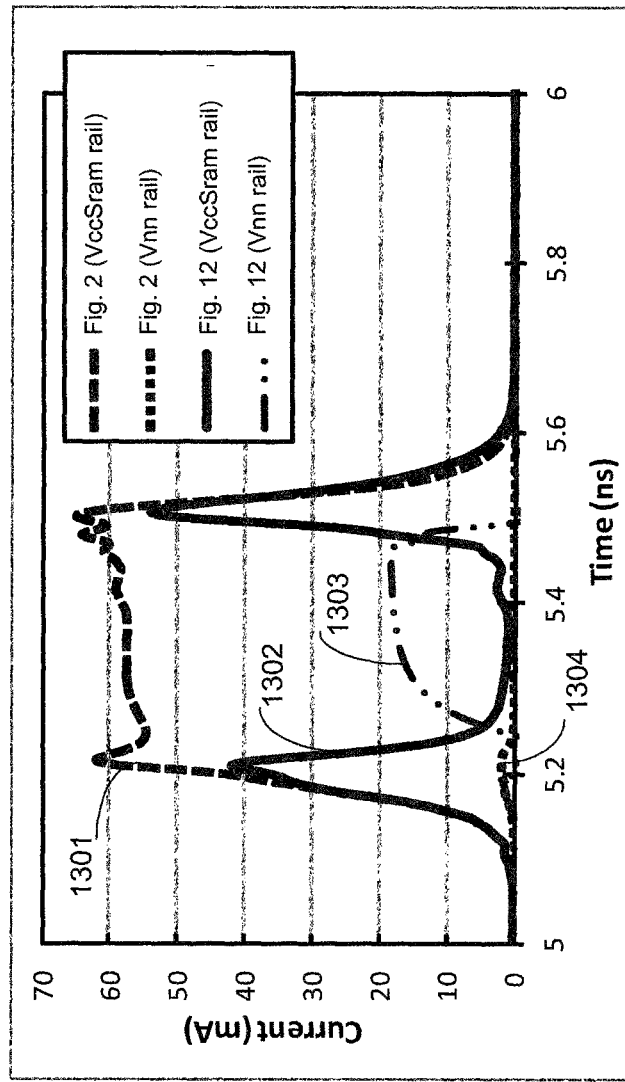
FIG. 13 is a plot showing reduction in peak current using the dual-rail write assist circuit of FIG. 12 compared to write assist circuit of FIG. 2, according to one embodiment of the disclosure.

FIG. 13 is a plot 1300 showing reduction in peak current using the dual-rail write assist circuit of FIG. 12 compared to write assist circuit of FIG. 2, according to one embodiment of the disclosure. Plot 1300 shows four waveforms, where x-axis is time (in ns) and y-axis is current (in mA).

Plot 1300 shows the benefit of using dual-rail write assist circuit 1200 of FIG. 12 over write assist circuit 200 of FIG. 2. Waveform 1301 is the peak current of VccSram power supply of FIG. 2. Waveform 1302 is the peak current of VccSram power supply of FIG. 12. Waveform 1304 is the peak current of Vnn power supply of FIG. 2. In one example, current of Vnn power supply is higher than that of the prior art current level of Vnn power supply. Waveform 1303 is the peak current of Vnn power supply of FIG. 12. The waveforms show that the dual-rail write assist circuit 1200 consumes far less power than the write assist circuit 200 of FIG. 2.

During the write operation, a reduction is seen for both peak current and dynamic power, where the benefit is about 40% reduction in power, for example. Plot 1300 shows how the current/power burden of the write assist operation is transferred from the VccSram rail to Vnn rail. In one embodiment, voltage droop on VccSram supply rail reduces by splitting of the two power domains as shown in FIG. 12—VccSram 1201 domain and Vnn 1202 domain.

In such an embodiment, VccSram has much less capacitance than the main SOC Vnn rail because of the splitting of voltage domains. One technical effect of splitting the voltage domains as shown in FIG. 12 is that cost associated with SRAM voltage regulator for the SRAM rail (package-cap, larger regulator etc.) is addressed. The embodiment of FIG. 12 also allows the integration of smaller bit-cell as the voltage droop is constrained to meet the active Vccmin of the SRAM bit-cell.

Figure 14:
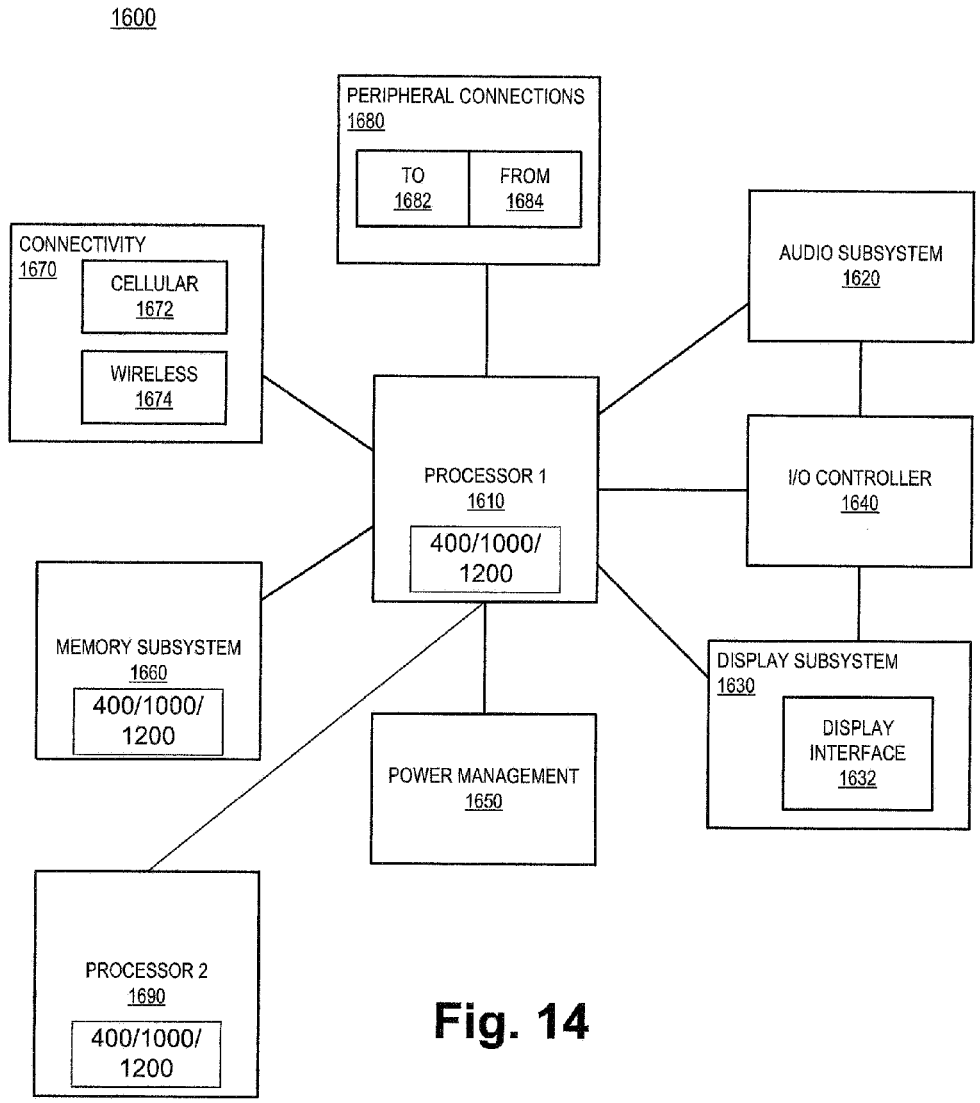
FIG. 14 is a smart device or a computer system or an SOC with the segmented SRAM array layout, dual-input level-shifter with integrated latch, and/or dual-rail write assist circuit, according to one embodiment of the disclosure.

FIG. 14 is a smart device 1600 or a computer system or an SOC with the segmented SRAM array layout 400, 500 (of FIG. 4 and FIG. 5), dual-input level-shifter 1000 with integrated latch (of FIG. 10), and/or dual-rail write assist circuit 1200 (of FIG. 12), according to one embodiment of the disclosure. It is pointed out that those elements of FIG. 14 having the same reference numbers (or names) as the elements of any other figure can operate or function in any manner similar to that described, but are not limited to such.

FIG. 14 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with a memory having segmented layout 400 of FIG. 4, and a second processor 1690 with memory having segmented layout 400 of FIG. 4, according to the embodiments discussed herein. Other blocks of the computing device with I/O drivers may also include memory having segmented layout 400 of FIG. 4. The various embodiments of the present disclosure may also comprise a network interface within 1670 such as a wireless interface so that a system embodiment may be incorporated into a wireless device, for example, cell phone or personal digital assistant.

In one embodiment, first processor 1610 includes dual-input level-shifter 1000 with integrated latch (of FIG. 10). In one embodiment, second processor 1690 includes dual-input level-shifter 1000 with integrated latch (of FIG. 10). Other blocks of the computing device with I/O drivers may also include dual-input level-shifter 1000 with integrated latch (of FIG. 10).

In one embodiment, first processor 1610 includes dual-rail write assist circuit 1200 (of FIG. 12). In one embodiment, second processor 1690 includes dual-rail write assist circuit 1200 (of FIG. 12). Other blocks of the computing device with I/O drivers may also include dual-rail write assist circuit 1200 (of FIG. 12).

In one embodiment, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. While the embodiments illustrate a 6T SRAM architecture, other SRAM architectures can also be used. For example, 4T, 5T, 8T, 16T SRAM architectures may be used with the embodiments. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment, an apparatus comprises: a plurality of memory arrays, local write assist logic units, and read/write local column multiplexers coupled together in a group such that area occupied by the local write assist logic units and the read/write local column multiplexers in the group is smaller than it would be when global write assist logic units and the read/write global column multiplexers are used.

In one embodiment, the global write assist logic units and the read/write global column multiplexers are coupled to non-segmented array of memory cells. In one embodiment, the non-segmented array of memory cells is larger in area than each of the plurality of memory arrays. In one embodiment, the non-segmented array of memory cells is larger in area than each of the plurality of memory arrays, local write assist logic units, and the read/write local column multiplexers combined.

In one embodiment, the apparatus further comprises power supply metal line for providing power to the plurality of memory arrays in the group. In one embodiment, the local write assist logic units comprises write assist p-type pull-up transistors to adjust power to the power supply metal line, and wherein the p-type pull-up transistors are smaller in size than p-type pull-up transistors of the global write assist logic units. In one embodiment, the read/write local column multiplexers comprises pass-gates to provide electrical coupling of global read and write data lines to generate local read and write signals.

In another example, a method for laying out memory comprises: segmenting an array of memory cells into a plurality of segmented array of memory cells; and downsizing area of global write assist logic units, for the segmented array of memory cells, to generate a plurality of local write assist logic units, wherein each of the local write assist logic units in the plurality of local write assist logic units is coupled to each of the segmented array of memory cells of the plurality of segmented array of memory cells.

In one embodiment, the method further comprises downsizing area of global read/write column multiplexers, for the segmented array of memory cells, to generate a plurality of local read/write column multiplexers, wherein each of the local read/write column multiplexers is coupled to each of the segmented array of memory cells of the plurality of segmented array of memory cells. In one embodiment, downsizing area of global write assist logic units, for the segmented array of memory cells to generate a plurality of local write assist logic units comprises reducing size of the pull-up p-type transistors of the global write assist logic units to generate local pull-up p-type transistors for the local write assist logic units.

In another examples, a system comprises: a memory unit; and a processor, coupled to the memory unit, the processor including cache memory comprising: a plurality of memory arrays, local write assist logic units, and read/write local column multiplexers coupled together in a group such that area occupied by the local write assist logic units and the read/write local column multiplexers in the group is smaller than it would be when global write assist logic units and the read/write global column multiplexers are used.

In one embodiment, the system further comprises: a display unit; and a wireless interface to allow the processor to communicate wirelessly with other devices. In one embodiment, memory unit is a DRAM. In one embodiment, the global write assist logic units and the read/write global column multiplexers are coupled to non-segmented array of memory cells. In one embodiment, the non-segmented array of memory cells is larger in area than each of the plurality of memory arrays. In one embodiment, the non-segmented array of memory cells is larger in area than each of the plurality of memory arrays, local write assist logic units, and the read/write local column multiplexers combined.

In one embodiment, the processor further comprises power supply metal line for providing power to the plurality of memory arrays in the group. In one embodiment, the local write assist logic units comprises write assist p-type pull-up transistors to adjust power to the power supply metal line, and wherein the p-type pull-up transistors are smaller in size than p-type pull-up transistors of the global write assist logic units. In one embodiment, the read/write local column multiplexers comprises pass-gates to provide electrical coupling of global read and write data lines to generate local read and write signals.

In another example, in one embodiment a computer readable storage medium is provided having computer readable instructions that when executed cause a machine to perform a method, the method comprising: segmenting an array of memory cells into a plurality of segmented array of memory cells; and downsizing area of global write assist logic units, for the segmented array of memory cells, to generate a plurality of local write assist logic units, wherein each of the local write assist logic units in the plurality of local write assist logic units is coupled to each of the segmented array of memory cells of the plurality of segmented array of memory cells.

In one embodiment, the computer readable storage has further computer readable instructions that when executed cause the machine to perform a further method comprising downsizing area of global read/write column multiplexers, for the segmented array of memory cells, to generate a plurality of local read/write column multiplexers, wherein each of the local read/write column multiplexers is coupled to each of the segmented array of memory cells of the plurality of segmented array of memory cells. In one embodiment, downsizing area of global write assist logic units, for the segmented array of memory cells to generate a plurality of local write assist logic units comprises reducing size of the pull-up p-type transistors of the global write assist logic units to generate local pull-up p-type transistors for the local write assist logic units.

In another example, in one embodiment, a level-shifter comprises: a first power supply to power a plurality of transistors of the level-shifter; a first input node to receive a first signal generated by a circuit operating on a second power supply, the second supply being different than the first power supply; a first n-type transistor to receive the first signal; a second input node to receive a second signal, which is an inverse of the first signal, the second signal generated by the circuit; and a second n-type transistor to receive the second signal, the first and second n-type transistors having drain terminals cross-coupled to some of the plurality of transistors.

In one embodiment, the level shifter further comprises an output node to generate an output signal according to the first and second signals. In one embodiment, the level-shifter is asynchronous. In one embodiment, the level-shifter is independent of a clock signal. In one embodiment, the level-shifter further comprises a third input node coupled to some of the plurality of transistors, the third input node to receive third signal to generate a deterministic output. In one embodiment, the level-shifter further comprises an output node to generate an output signal according to the first and second signals or third signal.

In one embodiment, some of the plurality of transistors operate as a latch. In one embodiment, the second power supply is higher than the first power supply. In one embodiment, the first power supply is higher than the second power supply.

In another example, a memory unit comprises: an array of memory cells; a column multiplexer coupled to the array of memory cells; a sense amplifier coupled to the column multiplexer; and an output data latch with integrated level-shifter includes: a first power supply to power a plurality of transistors of the level-shifter; a first input node to receive a first signal generated by a circuit operating on a second power supply, the second supply being different than the first power supply; a first n-type transistor to receive the first signal; a second input node to receive a second signal, which is an inverse of the first signal, the second signal generated by the circuit; and a second n-type transistor to receive the second signal, the first and second n-type transistors having drain terminals cross-coupled to some of the plurality of transistors.

In one embodiment, the array of memory cells is an array of SRAM cells. In one embodiment, the memory unit further comprises bit line pre-charge coupled to the column multiplexer. In one embodiment, the memory unit further comprises an output node to generate an output signal according to the first and second signals. In one embodiment, the output data latch with integrated level-shifter is asynchronous. In one embodiment, the output data latch with integrated level-shifter is independent of a clock signal.

In one embodiment, the memory unit further comprises a third input node coupled to some of the plurality of transistors, the third input node to receive third signal to generate a deterministic output. In one embodiment, the memory unit further comprises an output node to generate an output signal according to the first and second signals or third signal. In one embodiment, some of the plurality of transistors operate as a latch. In one embodiment, the second power supply is higher than the first power supply. In one embodiment, the first power supply is higher than the second power supply.

In another example, in one embodiment, a system comprise: a memory unit; and a processor coupled to the memory unit, the processor including a cache unit having a level-shifter according the level-shifter described in the embodiments.

In another example, an apparatus comprises: a write assist pulse generator operating on a first power supply; one or more pull-up devices coupled to the write assist pulse generator, the one or more pull-up devices operating on a second power supply different from the first power supply; and an output node to provide power supply to a memory cell.

In one embodiment, the memory cell is an SRAM cell. In one embodiment, the write assist pulse generator is operable to generate a write assist pulse to cause one or more pull-up devices to couple the second power supply to the output node. In one embodiment, the write assist pulse generator is operable to generate a write assist pulse to cause the power supply to adjust relative to another power supply. In one embodiment, the output node is coupled to the write assist pulse generator.

In one embodiment, the output node is coupled to the first power supply in response to a wake-up signal. In one embodiment, the output node is coupled to a third power supply in response to a sleep signal. In one embodiment, the third power supply is a sleep power supply.

In another example, in one embodiment a system comprises: a memory unit; and a processor, coupled to the memory unit, the processor having a cache memory unit which comprises: an array of memory cells operating on a first power supply; and a write assist circuit coupled to the array of memory cells, the write assist circuit to lower first power supply during write operation to the array of memory cells, the write assist circuit according the write assist circuit described in the embodiments. In one embodiment, the system further comprises a display unit; and a wireless interface to allow the processor to communicate wirelessly with other devices. In one embodiment, the memory unit is a DRAM.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a segmented memory array having a plurality of memory sub-arrays including a first memory sub-array and a second memory sub-array, wherein the first memory sub-array comprises a row and a column of memory bit-cells, and wherein the second memory sub-array comprises a row and a column of memory bit-cells;
a plurality of local control circuitries including a first local control circuitry and a second local control circuitry, wherein the first local control circuitry is coupled to the first memory sub-array, and wherein the second local control circuitry is coupled to the second memory sub-array;
a plurality of local circuitries including a first local circuitry and a second local circuitry, wherein the first local circuitry is coupled to the first memory sub-array, and wherein the second local circuitry is coupled to the second memory sub-array;
a global circuitry coupled to the first local circuitry and to the second local circuitry;
a global control circuitry coupled to the first local control circuitry and to the second local control circuitry; and
a plurality of local power lines including a first local power line and a second local power line, wherein the first local power line is to provide power to the memory bit-cells of the first memory sub-array, and wherein the second local power line is to provide power to the memory bit-cells of the second memory sub-array, wherein the first and second local power lines are independently controllable.

2. The apparatus of claim 1, wherein the first and second memory sub-arrays comprise an SRAM.

3. The apparatus of claim 1, wherein the first local control circuitry and the second local control circuitry comprise column mux selectors.

4. The apparatus of claim 1, wherein the first local circuitry and the second local circuitry comprise write drivers.

5. The apparatus of claim 1, wherein the global circuitry and the global control circuitry is on-die with the plurality of local circuitries and the plurality of local control circuitries.

6. The apparatus of claim 1, wherein the global circuitry comprises read/write global column multiplexers.

7. The apparatus of claim 1, wherein the global control circuitry comprises write drivers.

8. The apparatus of claim 1, wherein the first local circuitry has an area which is smaller than an area of the global circuitry.

9. The apparatus of claim 1, wherein the first local control circuitry has an area which is smaller than an area of the global control circuitry.

10. The apparatus of claim 1, wherein the plurality of memory sub-arrays, plurality of local control circuitries, and plurality of local circuitries are coupled together in a group such that area occupied by the plurality of local control circuitries and the local circuitries in the group is smaller than it would if only global circuitry and global control circuitry were used instead.

11. A method comprising:
segmenting a memory array into a plurality of memory sub-arrays including a first memory sub-array and a second memory sub-array, wherein the first memory sub-array comprises a row and a column of memory bit-cells, and wherein the second memory sub-array comprises a row and a column of memory bit-cells;
providing a plurality of local control circuitries including a first local control circuitry and a second local control circuitry;
coupling the first local control circuitry to the first memory sub-array;
coupling the second local control circuitry to the second memory sub-array;
providing a plurality of local circuitries including a first local circuitry and a second local circuitry;
coupling the first local circuitry to the first memory sub-array;
coupling the second local circuitry to the second memory sub-array;
coupling a global circuitry to the first local circuitry and to the second local circuitry;
coupling a global control circuitry to the first local control circuitry and to the second local control circuitry; and
providing a plurality of local power lines including a first local power line and a second local power line, wherein the first local power line is to provide power to the memory bit-cells of the first memory sub-array, and wherein the second local power line is to provide power to the memory bit-cells of the second memory sub-array, wherein the first and second local power lines are independently controllable.

12. The method of claim 11, wherein the first and second memory sub-arrays comprise an SRAM.

13. The method of claim 11, wherein the first local control circuitry and the second local control circuitry comprise column mux selectors.

14. The method of claim 11, wherein the first local circuitry and the second local circuitry comprise write drivers.

15. The method of claim 11, wherein the global circuitry and the global control circuitry is on-die with the plurality of local circuitries and the plurality of local control circuitries.

16. An apparatus comprising:
segmented memory array means as a plurality of memory sub-arrays including a first memory sub-array and a second memory sub-array, wherein the first memory sub-array comprises a row and a column of memory bit-cells, and wherein the second memory sub-array comprises a row and a column of memory bit-cells;
a plurality of local control means including a first local control circuitry and a second local control circuitry;
means for coupling the first local control circuitry to the first memory sub-array;
means for coupling the second local control circuitry to the second memory sub-array;
a plurality of local means including a first local circuitry and a second local circuitry;
means for coupling the first local circuitry to the first memory sub-array;
means for coupling the second local circuitry to the second memory sub-array;
means for coupling a global circuitry to the first local circuitry and to the second local circuitry;
means for coupling a global control circuitry to the first local control circuitry and to the second local control circuitry; and
means for providing a plurality of local power lines including a first local power line and a second local power line, wherein the first local power line is to provide power to the memory bit-cells of the first memory sub-array, and wherein the second local power line is to provide power to the memory bit-cells of the second memory sub-array, wherein the first and second local power lines are independently controllable.

17. The apparatus of claim 16, wherein the first and second memory sub-arrays comprise an SRAM.

18. A system comprising:
a processor;
a memory coupled to the processor, wherein the memory includes:
a segmented memory array having a plurality of memory sub-arrays including a first memory sub-array and a second memory sub-array, wherein the first memory sub-array comprises a row and a column of memory bit-cells, and wherein the second memory sub-array comprises a row and a column of memory bit-cells;
a plurality of local control circuitries including a first local control circuitry and a second local control circuitry, wherein the first local control circuitry is coupled to the first memory sub-array, and wherein the second local control circuitry is coupled to the second memory sub-array;
a plurality of local circuitries including a first local input-output circuitry and a second local input-output circuitry, wherein the first local circuitry is coupled to the first memory sub-array, and wherein the second local circuitry is coupled to the second memory sub-array;
a global circuitry coupled to the first local circuitry and to the second local circuitry;
a global control circuitry coupled to the first local control circuitry and to the second local control circuitry; and
a plurality of local power lines including a first local power line and a second local power line, wherein the first local power line is to provide power to the memory bit-cells of the first memory sub-array, and wherein the second local power line is to provide power to the memory bit-cells of the second memory sub-array, wherein the first and second local power lines are independently controllable; and
a wireless interface to allow the processor to communicate with another device.

19. The system of claim 18 comprises a display unit.

20. The system of claim 18, wherein the first and second memory sub-arrays comprise an SRAM.

21. The system of claim 18, wherein the first local control circuitry and the second local control circuitry comprise column mux selectors, and wherein the first local circuitry and the second local control circuitry comprise write drivers.

22. The system of claim 18, wherein the global circuitry and the global control circuitry is on-die with the plurality of local circuitries and the plurality of local control circuitries.

23. The system of claim 18, wherein the global circuitry comprises read/write global column multiplexers, and wherein the global control circuitry comprises write drivers.

24. The system of claim 18 further comprises power supply metal line to provide power to the plurality of memory sub-arrays.

25. The system of claim 18, wherein the first local circuitry has an area which is smaller than an area of the global circuitry, and wherein the first local control circuitry has an area which is smaller than an area of the global control circuitry.

26. The system of claim 18, wherein the plurality of memory sub-arrays, plurality of local control circuitries, and plurality of local circuitries are coupled together in a group such that area occupied by the plurality of local control circuitries and the local circuitries in the group is smaller than it would if only global circuitry and global control circuitry were used instead.

27. The apparatus of claim 1 comprises a global supply line, wherein the plurality of local power lines are coupled to the global supply line via a circuitry.

* * * * *